United States Patent
Nakase

(10) Patent No.: US 9,234,928 B2
(45) Date of Patent: Jan. 12, 2016

(54) ELECTRIC FIELD PROBE

(71) Applicant: MURATA MANUFACTURING CO., LTD., Kyoto (JP)

(72) Inventor: Masaki Nakase, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 202 days.

(21) Appl. No.: 13/948,952

(22) Filed: Jul. 23, 2013

(65) Prior Publication Data

US 2013/0307522 A1    Nov. 21, 2013

Related U.S. Application Data

(63) Continuation of application No. PCT/JP2012/000231, filed on Jan. 17, 2012.

(30) Foreign Application Priority Data

Jan. 24, 2011  (JP) .................................. 2011-012139

(51) Int. Cl.
*G01R 19/00* (2006.01)
*G01R 29/08* (2006.01)
(Continued)

(52) U.S. Cl.
CPC ............ *G01R 29/08* (2013.01); *G01R 29/0878* (2013.01); *H01Q 9/30* (2013.01); *H01Q 19/10* (2013.01)

(58) Field of Classification Search
CPC .... G01R 19/0092; G01R 1/203; G01R 1/071; G01R 31/2642; G01R 23/04; G01R 23/02; G01R 1/06788; G01R 11/04; G01R 31/2648; G01R 31/312; G01R 31/311; G01N 27/023; G01N 27/22; G01N 27/025; G01N 27/06; H01Q 13/18; H01Q 1/286; H01Q 1/42; H01Q 9/28; H01Q 9/30; H01Q 9/16; H01Q 21/10; H01Q 21/30; H01Q 15/0006; H01Q 15/02; H01Q 3/46; H01Q 3/44; H01Q 15/141; H01Q 15/142; H01Q 15/144
USPC .............. 324/76.11, 76.51, 149, 445, 754.27; 343/790–791, 909, 912
See application file for complete search history.

(56) References Cited

U.S. PATENT DOCUMENTS 5,406,194 A * 4/1995 Dykaar .................. G01R 1/071
                                                    324/117 R
6,527,768 B2 * 3/2003 Berube .............. A61B 18/1815
                                                       606/33
(Continued)

FOREIGN PATENT DOCUMENTS

JP    H11-55026 A     2/1999
JP    2001-255347 A   9/2001
(Continued)

OTHER PUBLICATIONS

An Office Action; "Notice of Reasons for Rejection," issued by the Japanese Patent Office on Dec. 2, 2014, which corresponds to Japanese Patent Application No. 2012-554660 and is related to U.S. Appl. No. 13/948,952; with English language translation.

(Continued)

*Primary Examiner* — Tung X Nguyen
*Assistant Examiner* — Thang Le
(74) *Attorney, Agent, or Firm* — Studebaker & Brackett PC

(57) ABSTRACT

There is provided an electric field probe that can narrow a receiving range to a desired range when measuring a near electric field. An electric field probe includes a rodlike monopole antenna, and a conductive reflective member provided coaxially with the monopole antenna to cover the monopole antenna. The reflective member is open at its bottom in an axial direction of the monopole antenna.

10 Claims, 10 Drawing Sheets

(51) Int. Cl.
  *H01Q 9/30*  (2006.01)
  *H01Q 19/10*  (2006.01)

(56) References Cited

U.S. PATENT DOCUMENTS

| | | | | |
|---|---|---|---|---|
| 6,806,841 | B2* | 10/2004 | Nilsson | H01Q 1/3275 |
| | | | | 343/773 |
| 7,286,094 | B2* | 10/2007 | Ratni | H01Q 9/28 |
| | | | | 343/772 |
| 8,847,617 | B2* | 9/2014 | Nickel | G01R 31/3025 |
| | | | | 324/754.21 |
| 2001/0029368 | A1* | 10/2001 | Berube | 606/33 |
| 2002/0109497 | A1* | 8/2002 | Brachat et al. | 324/95 |
| 2008/0150822 | A1* | 6/2008 | Hasegawa | H01Q 1/246 |
| | | | | 343/790 |
| 2011/0077634 | A1* | 3/2011 | Brannan | 606/33 |

FOREIGN PATENT DOCUMENTS

| | | | |
|---|---|---|---|
| JP | 2001255347 | * | 9/2001 |
| JP | 2002-141742 A | | 5/2002 |
| JP | 2004-037109 A | | 2/2004 |
| JP | 2010-148035 A | | 7/2010 |

OTHER PUBLICATIONS

International Search Report; PCT/JP2012/000231; Apr. 17, 2012.
Written Opinion of the International Searching Authority; PCT/JP2012/000231; Apr. 17, 2012.

* cited by examiner

COMPARATIVE EXAMPLE

ELECTRIC FIELD PROBE

CROSS REFERENCE TO RELATED APPLICATIONS

The present application is a continuation of International Application No. PCT/JP2012/000231 filed on Jan. 17, 2012, and claims priority to Japanese Patent Application No. 2011-012139 filed on Jan. 24, 2011, the entire contents of each of these applications being incorporated herein by reference in their entirety.

TECHNICAL FIELD

The technical field relates to an electric field probe for measuring a near electric field.

BACKGROUND

Japanese Unexamined Patent Application Publication No. 2002-141742 (Patent Document 1) described below discloses a technique for increasing distant-field directivity of a half-wavelength dipole antenna. More specifically, Patent Document 1 discloses that a comparatively small half-wavelength dipole antenna with high front-to-back ratio (F/B ratio) can be obtained by setting the half-wavelength dipole antenna at the center in a width direction and a height direction of one or a plurality of reflective plates and setting the height of the reflective plate or plates within the range of 1.3 to 1.7 times the wavelength of a used frequency.

SUMMARY

The present disclosure provides an electric field probe that can narrow a receiving range to a desired range when measuring a near electric field.

In one aspect of the disclosure, an electric field probe includes a rodlike monopole antenna, and a hollow and conductive reflective member provided coaxially with the monopole antenna to cover the monopole antenna. One end portion of the reflective member is open in an axial direction of the monopole antenna.

In a more specific embodiment of the electric field probe of the present disclosure, the monopole antenna may be provided such that one end portion of the monopole antenna is substantially aligned with an open end face of the reflective member.

In another more specific embodiment of the electric field probe of the present disclosure, the open one end portion of the reflective member may be spread wider than the other end portion.

In yet another mores specific embodiment, the reflective member may be shaped like a cone with a bottom open, a quadrangular pyramid with a bottom open, or a hollow hemisphere with a bottom open.

DETAILED DESCRIPTION

Figure 1:
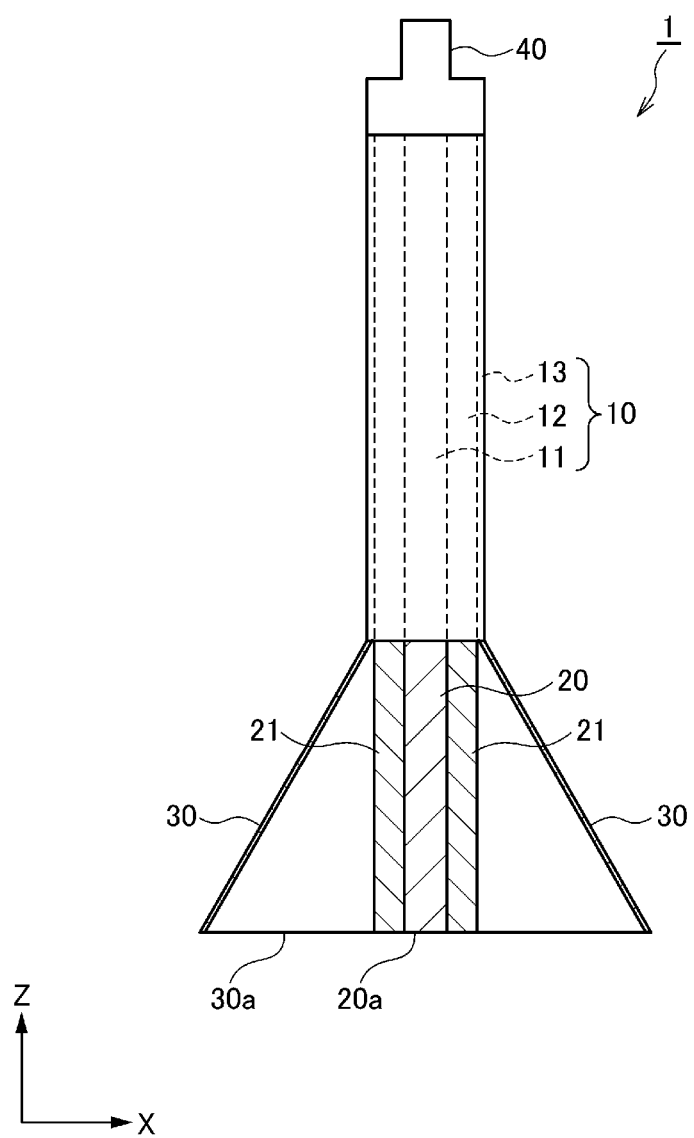
FIG. 1 is a partial sectional view illustrating a structure of an electric field probe according to an exemplary embodiment.

The inventor realized that when a near electric field of an object to be measured is measured with the antenna described in Patent Document 1, noise is also picked up from a noise source existing around a point to be measured, and this makes it difficult to perform accurate measurement. That is, it is difficult to accurately grasp the position of the noise source and the noise intensity.

A preferred embodiment that can address the above shortcoming will now be described in detail below with reference to the drawings. In the drawings, like elements are denoted by like reference numerals, and descriptions thereof are not repeated to avoid redundancy.

First, a structure of an electric field probe 1 according to the embodiment will be described with reference to FIG. 1. FIG. 1 is a partial sectional view illustrating the structure of the electric field probe 1.

For example, the electric field probe 1 is an electric field probe that measures a near electric field of an electronic circuit board. The electric field probe 1 includes a columnar main body 10, a rodlike monopole antenna 20 continuously connected to a distal end portion of the main body 10, and a reflective member 30 shaped like a hollow cone and provided coaxially with the monopole antenna 20 to cover the monopole antenna 20. Next, the constituent elements will be described in detail.

For example, the main body 10 is a semirigid cable having a coaxial structure, in which an inner conductor (core) 11 formed by a silver-plated copper tube is covered with a dielectric (PTFE) 12 and the dielectric 12 is covered with an outer conductor 13 formed of oxygen-free copper. In this embodiment, the main body 10 is 9.62 mm in diameter and 40 mm in length.

The monopole antenna 20 is formed by removing a portion of the outer conductor 13 at the distal end portion of the semirigid cable protruding from the main body 10 so that the inner conductor 11 is exposed by a predetermined length (30 mm in the embodiment) from the distal end portion of the main body 10. That is, in the embodiment, the inner conductor 11 in the semirigid cable is used as the monopole antenna 20. Therefore, the monopole antenna 20 is electrically connected to the inner conductor 11 in the main body 10. A periphery of the monopole antenna 20 is covered with a dielectric 21 provided integrally with the dielectric 12.

As illustrated in FIG. 1, the monopole antenna 20 is provided such that a distal end portion 20a is aligned with an open end face 30a of the reflective member 30 in side view. A signal received by the monopole antenna 20 is output to, for example, a measuring device via the inner conductor 11 of the main body 10 and an SMA connector 40 that will be described below.

The reflective member 30 is formed of metal having conductivity, such as copper, and is shaped like a hollow cone with its bottom open. The reflective member 30 is attached to a distal end portion of the outer conductor 13 included in the main body 10 coaxially with the monopole antenna 20 so as to cover the monopole antenna 20. The reflective member 30 is open at its bottom in an axial direction of the monopole antenna 20.

The diameter of the open end face 30a of the reflective member 30 is set according to a desired receiving range (measuring range). That is, the diameter of the open end face 30a is decreased to narrow the receiving range (measuring range). Here, in the embodiment, the open end face 30a of the reflective member 30 is 35 mm in diameter, and the reflective member 30 is 30 mm in length in the axial direction. The reflective member 30 is connected to the ground of, for example, a measuring device via the outer conductor 13 in the main body 10 and the SMA connector 40.

The SMA connector 40 to be connected to a measuring device, such as a spectrum analyzer, is attached to a rear end portion of the main body 10. During use, the electric field probe 1 is connected to the measuring device, such as a spectrum analyzer, via a coaxial cable connected to the SMA connector 40.

Figure 2:
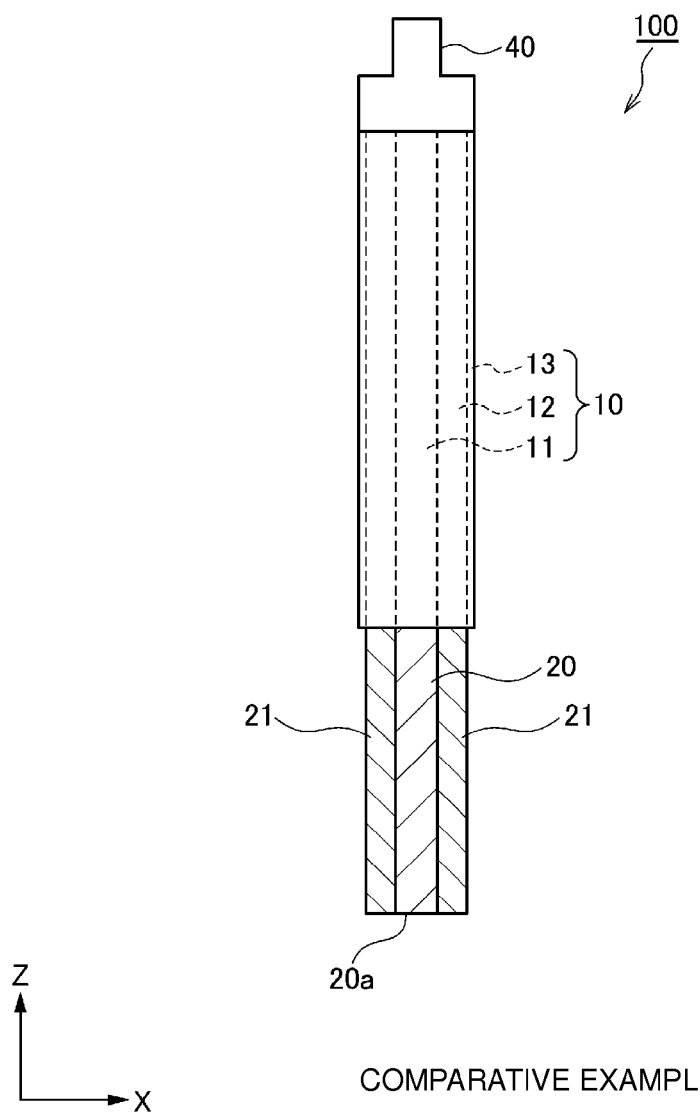
FIG. 2 illustrates a structure of en electric field probe having no reflective member, which is used as a comparative example.
Figure 3:
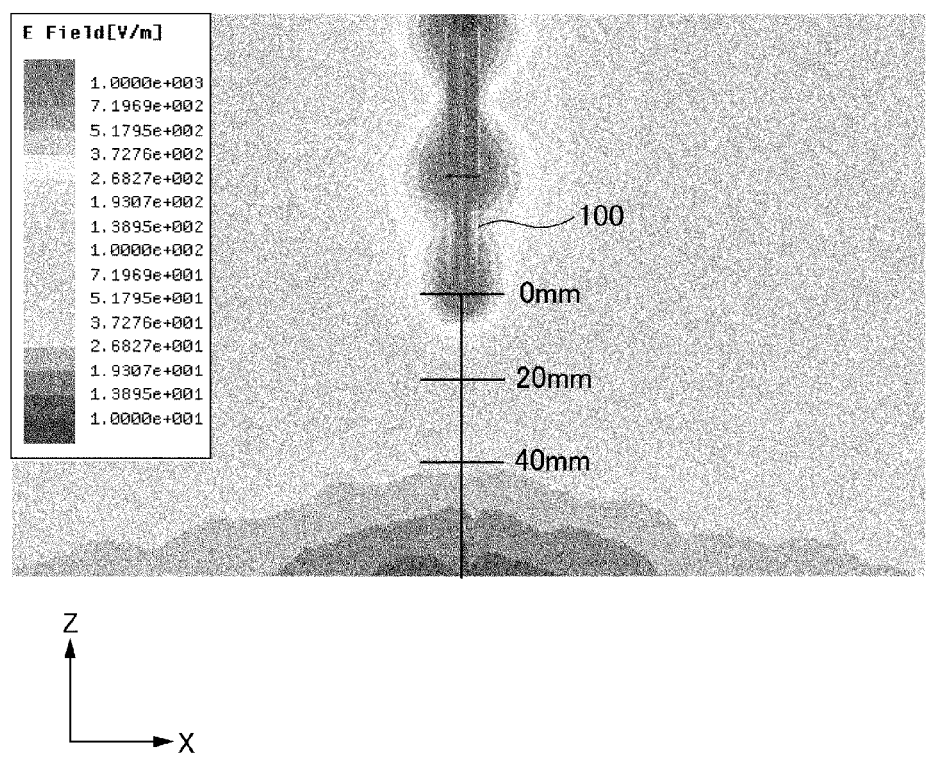
FIG. 3 illustrates an electric field distribution (receiving range) in an X-Z direction (XZ plane) of the electric field probe having no reflective member used as the comparative example.
Figure 4:
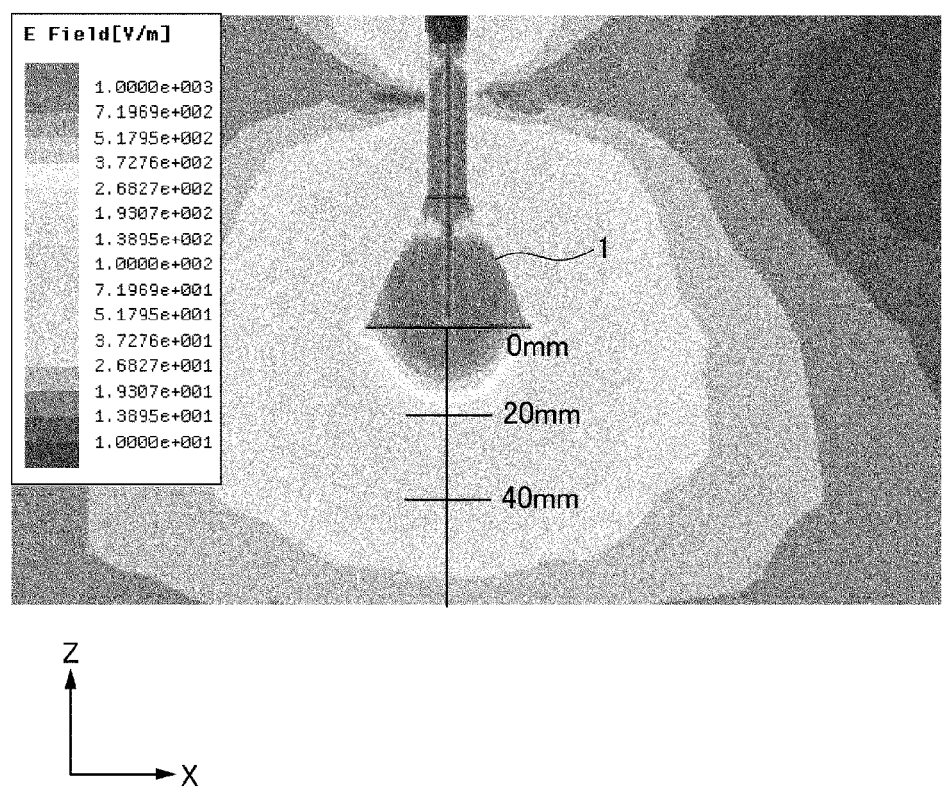
FIG. 4 illustrates an electric field distribution (receiving range) in the X-Z direction (XZ plane) of the electric field probe according to the exemplary embodiment.
Figure 5:
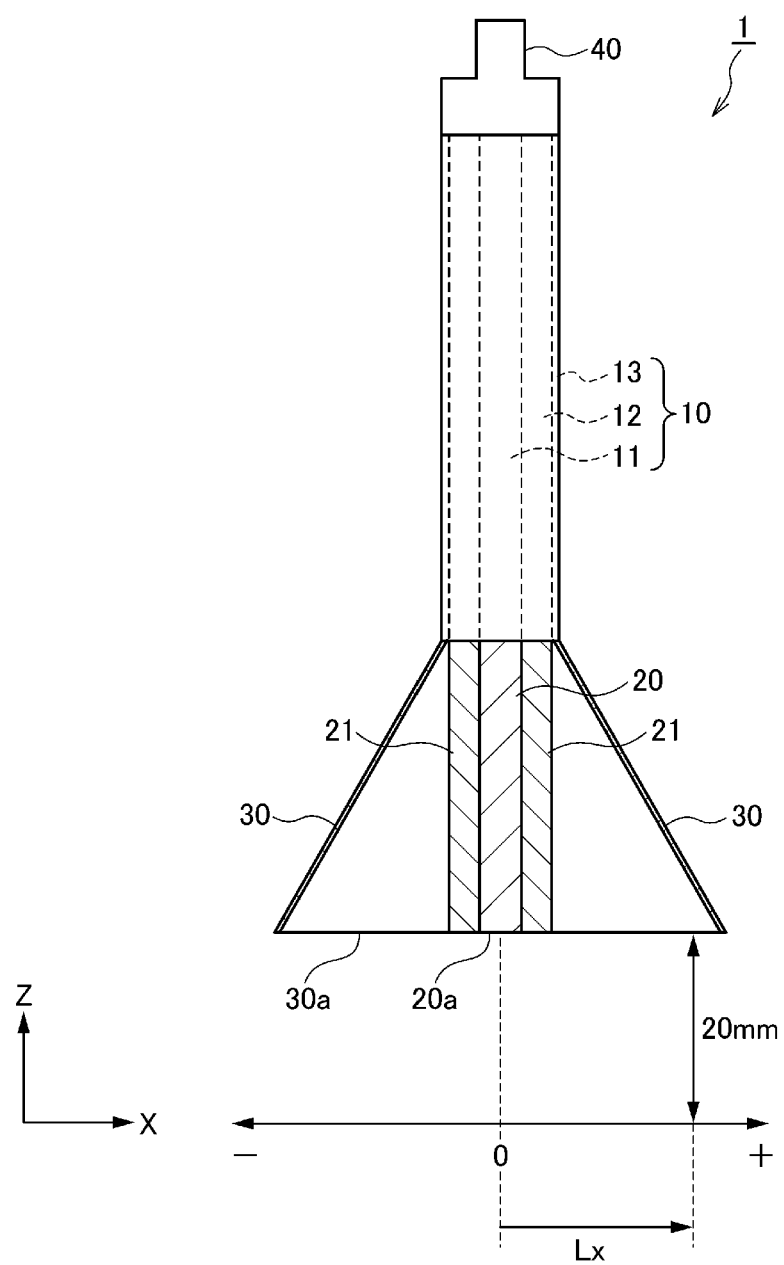
FIG. 5 explains an electric-field strength (receiving range) illustrated in FIG. 6.
Figure 6:
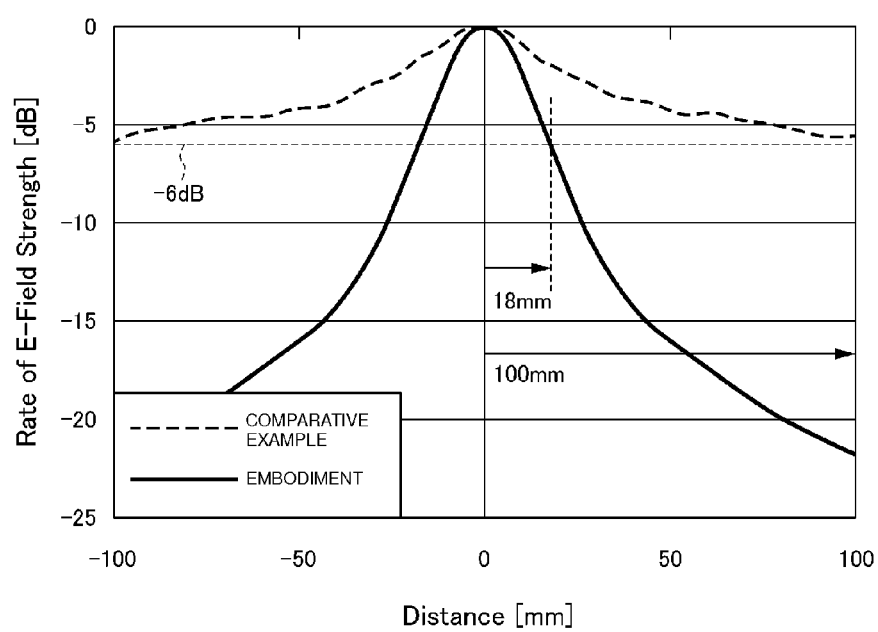
FIG. 6 illustrates an electric-field strength (receiving range) in an X-axis direction at a position 20 mm below a distal end portion of the electric field probe.

Next, the difference in the receiving range of the electric field probe between the presence and absence of the reflective member 30 will be described according to simulation results with reference to FIGS. 2 to 6. Here, FIG. 2 illustrates a structure of an electric field probe 100 used as a comparative example, in which the reflective member 30 is not provided, and FIG. 3 illustrates an electric field distribution (receiving range) in an X-Z direction (XZ plane) of the electric field probe 100. FIG. 4 illustrates an electric field distribution (receiving range) in the X-Z direction (XZ plane) of the electric field probe 1 according to the present embodiment. FIG. 6 illustrates electric-field strengths (receiving ranges) in the X-axis direction at positions 20 mm below the distal end portions of the electric field probes 1 and 100. FIG. 5 explains the electric-field strengths (receiving ranges) illustrated in FIG. 6. Here, the axial direction (up-down direction in FIGS. 2 and 5) of the electric field probes 1 and 100 (monopole antenna 20) is referred to as a Z-axis direction, and a direction (right-left direction in FIGS. 2 and 5) orthogonal to the axes of the electric field probes 1 and 100 (monopole antenna 20) is referred to as an X-axis direction.

As illustrated in FIG. 2, in the electric field probe 100 used as the comparative example, the reflective member 30 in the electric field probe 1 of the embodiment is removed. Since other structures are the same as those adopted in the electric field probe 1, detailed descriptions thereof are not repeated here. In a simulation, the electric field probes 1 and 100 were modeled, and electric field distributions of the electric field probes 1 and 100 were found using simulation software (HFSS from Ansoft Corporation). More specifically, the electric field distributions of the electric field probes 1 and 100 were checked by calculating transmission characteristics when a sine wave of 1 W was supplied to the electric field probes 1 and 100 from the rear end portion of the modeled main body 10. According to the reciprocity theorem, the transmission characteristics of the electric field probes 1 and 100 served as receiving characteristics thereof.

The results of the simulation are demonstrated in FIGS. 3 and 4. As described above, FIG. 3 illustrates the electric field distribution (receiving range) in the X-Z direction (XZ plane) of the electric field probe 100 (comparative example), and FIG. 4 illustrates the electric field distribution (receiving range) in the X-Z direction (XZ plane) of the electric field probe 1 of the present embodiment. As illustrated in FIGS. 3 and 4, it was found that the spread of the electric field distribution in the X-axis direction was narrower in the electric field probe 1 of the embodiment than in the electric field probe 100 in which the reflective member 30 was not provided (comparative example). Therefore, it could be confirmed that the receiving range of the near electric field was narrower in the electric field probe 1 than in the electric field probe 100.

Next, FIG. 6 demonstrates the electric-field strengths (receiving ranges) in the X-axis direction at positions 20 mm below the distal end portions of the electric field probes 1 and 100. In a graph of FIG. 6, the horizontal axis indicates the distance (mm) in the X-axis direction from positions just beneath the electric field probes 1 and 100, and the vertical axis indicates the electric-field strength (dB). Further, in the graph of FIG. 6, a simulation result of the electric field probe 1 of the embodiment is shown by a solid line, and a simulation result of the electric field probe 100 of the comparative example is shown by a broken line.

As demonstrated in FIG. 6, when a distance Lx (see FIG. 5) in the X-direction between a position just beneath the probe, where the electric-field strength was the largest, and a position where the electric-field strength (receiving amount) was smaller by 6 dB or more than the electric-field strength just beneath the probe was 100 mm or more in the electric field probe 100 (comparative example). In contrast, the distance Lx was 18 mm in the electric field probe 1 of the embodiment. Hence, it was confirmed that the receiving range was narrowed at the position 20 mm below the distal end portion of the electric field probe 1 or 100 in the electric field probe 1. From the above results, it was confirmed that the receiving range of the near electric field could be narrowed by using the electric field probe 1 of the embodiment.

As described in detail above, according to the embodiment, the periphery of the monopole antenna 20 is covered with the conductive reflective member 30. This reflective member 30 is provided such that the aperture portion faces in the axial direction of the monopole antenna 20, that is, in the null direction. For this reason, noise that is going to enter from a lateral direction of the electric field probe 1 (a direction perpendicular to the axis of the monopole antenna 20, that is, a direction in which the monopole antenna 20 exhibits directivity) is blocked. As a result, it is possible to measure only noise from a noise source located in the axial direction of the monopole antenna 20 (electric field probe 1) (for example, a directly downward direction when the electric field probe 1 is used with the aperture portion (distal end portion) facing down from above an object to be measured). Hence, it is possible to measure the near electric field within a narrowed receiving range.

If the distal end portion 20a of the monopole antenna 20 protrudes outward from the aperture end face of the reflective member 30, noise from the lateral direction (the direction perpendicular to the axis of the monopole antenna 20, that is, the direction in which the monopole antenna 20 has directivity) is easily picked up, and the receiving range is widened. Conversely, if the distal end portion 20a of the monopole antenna 20 recedes inward from the open end face of the reflective member 30 (that is, the reflective member 30 is longer than the monopole antenna 20 in the axial direction), the reflective member 30 picks up noise, the ground (reference) potential fluctuates, and this deteriorates the receiving sensitivity. According to the embodiment, since the distal end portion 20a of the monopole antenna 20 and the open end face 30a of the reflective member 30 are substantially aligned with each other, the receiving range can be narrowed while maintaining high receiving sensitivity.

Further, according to the embodiment, since the reflective member 30 is shaped like a cone with its bottom open, that is, since the open end portion of the reflective member 30 is spread wider than the other end portion, the receiving sensitivity can be increased further.

Figure 7:
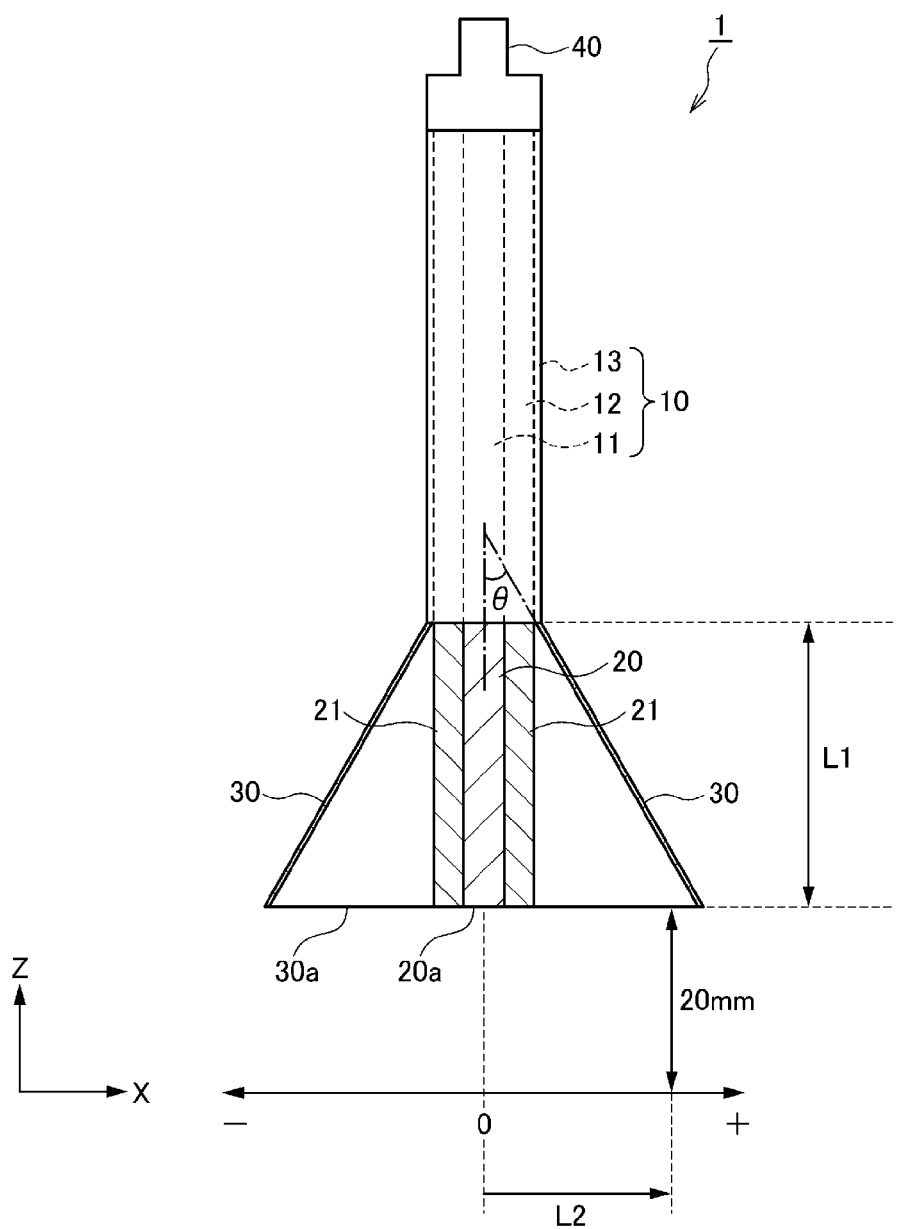
FIG. 7 illustrates preferred dimensions of the electric field probe of the embodiment.

The receiving sensitivity and the near electric-field receiving range (measuring range) of the electric field probe 1 vary according to the dimensions of the electric field probe 1, more specifically, for example, according to a length L1 of the monopole antenna 20 included in the electric field probe 1 and an angle θ formed between the center line (axis) of the monopole antenna 20 and the reflective member 30 (hereinafter simply referred to as "angle θ of the reflective member 30") illustrated in FIG. 7.

Figure 8:
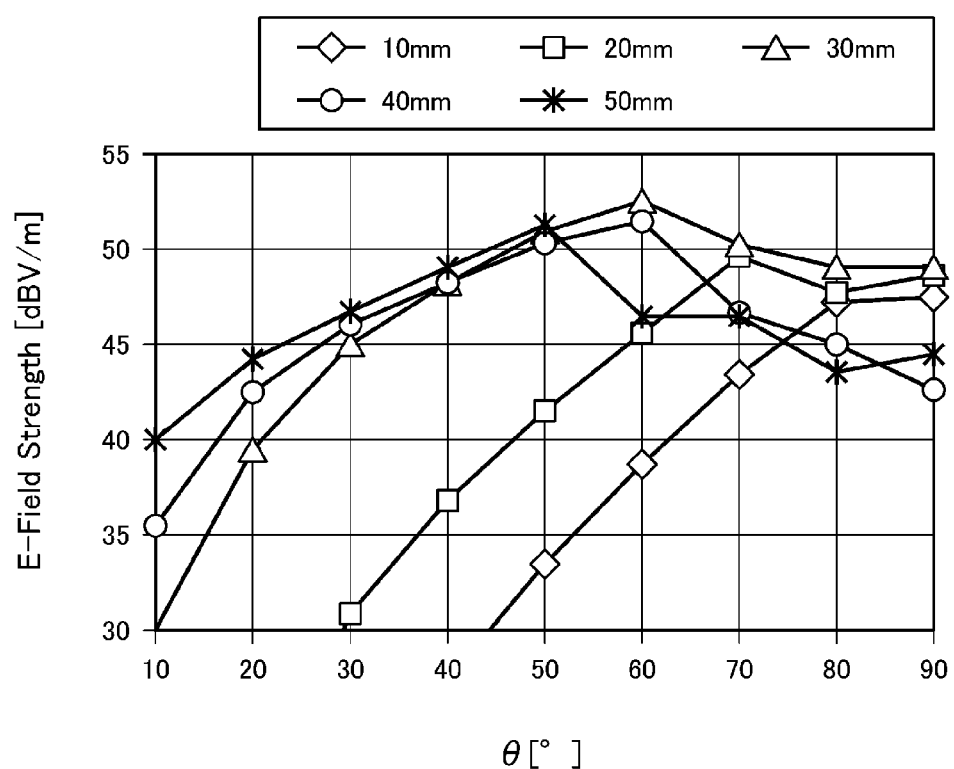
FIG. 8 is a graph demonstrating the relationship between an angle θ of a reflective member and a receiving sensitivity when a length L1 of a monopole antenna is changed.
Figure 9:
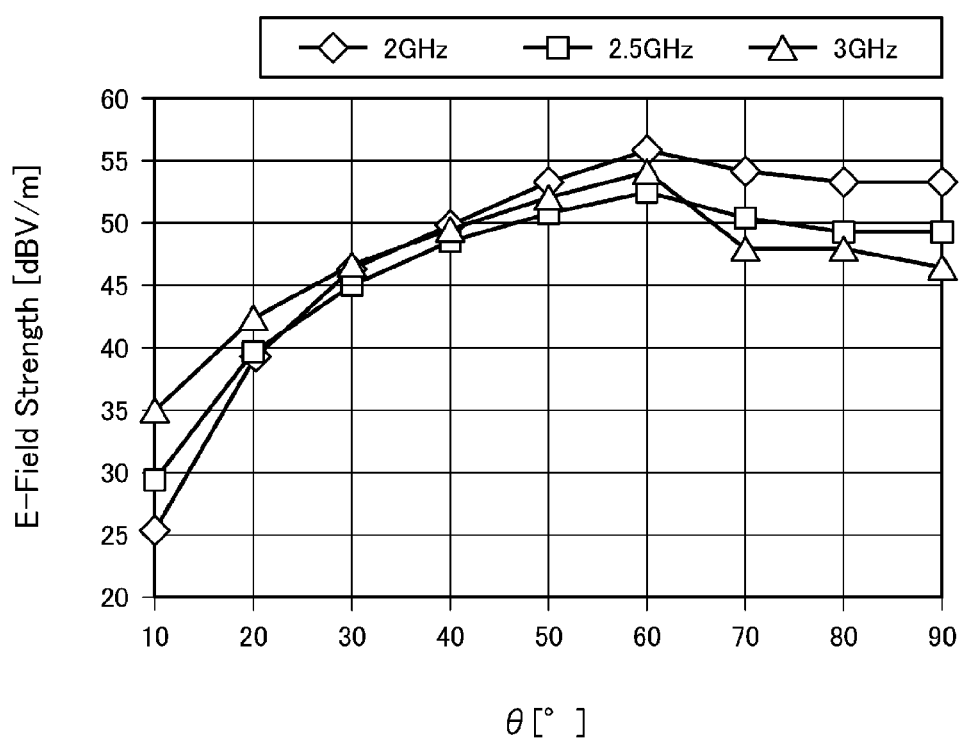
FIG. 9 is a graph demonstrating the relationship between the angle θ of the reflective member and the receiving sensitivity when a measuring frequency is changed.
Figure 10:
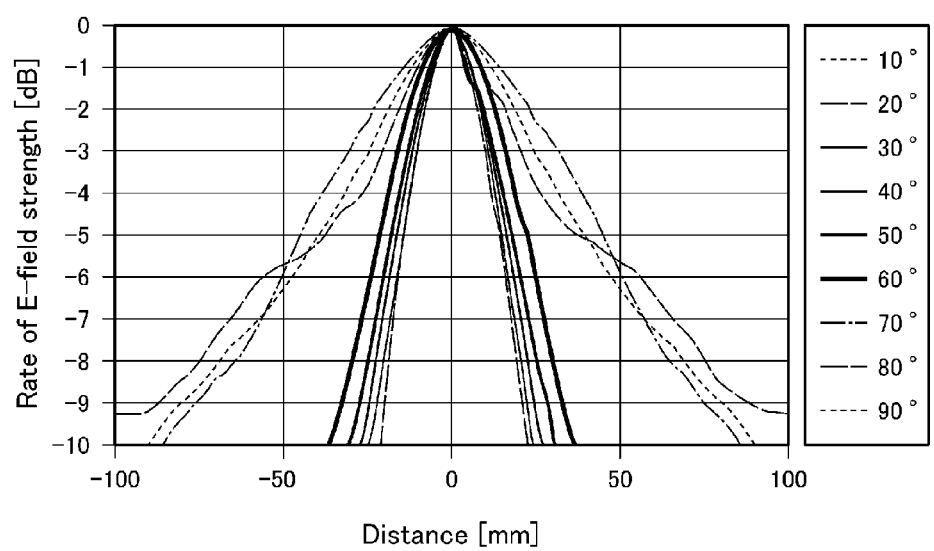
FIG. 10 is a graph demonstrating the electric-field strength (receiving range) in the X-axis direction when the angle θ of the reflective member is changed.

Accordingly, a description will be given of a preferred length of the monopole antenna 20 and a preferred angle of the reflective member 30 with reference to FIGS. 7 to 10. FIG. 7 depicts preferred dimensions of the electric field probe 1. FIG. 8 is a graph demonstrating the relationship between the angle θ of the reflective member 30 and the receiving sensitivity when the length L1 of the monopole antenna 20 is changed. FIG. 9 is a graph demonstrating the relationship between the angle θ of the reflective member 30 and the receiving sensitivity when the measuring frequency is changed. FIG. 10 demonstrates the electric-field strength (receiving range) in the X-axis direction when the angle θ of the reflective member 30 is changed.

Preferably, in the electric field probe 1, the length L1 of the monopole antenna 20 is set such that "20 mm≤L1≤50 mm", the angle θ of the reflective member 30 is set such that "50°≤θ<70°", and the open end face 30a of the reflective member 30 and the distal end portion 20a of the monopole antenna 20 are aligned with each other. This can increase the receiving sensitivity and narrow the receiving range.

More preferably, in the electric field probe 1, the length L1 of the monopole antenna 20 is set such that "30 mm≤L1≤40 mm", the angle θ of the reflective member 30 is set at "about 60°", and the open end face 30a of the reflective member 30 and the distal end portion 20a of the monopole antenna 20 are aligned with each other. This can further increase the receiving sensitivity, and further narrow the receiving range. The reason for that will be described below in conjunction with simulation results with reference to FIGS. 8, 9, and 10.

First, with reference to FIG. 8, a description will be given of the relationship between the angle θ of the reflective member 30 and the receiving sensitivity when the length L1 of the monopole antenna 20 is changed. The distal end portion 20a of the monopole antenna 20 is set to be aligned with the open end face 30a of the reflective member 30. In FIG. 8, the horizontal axis indicates the angle θ (°) of the reflective member 30, and the vertical axis indicates the receiving sensitivity (dBV/m).

FIG. 8 demonstrates results of simulations of the angle θ of the reflective member 30 and the receiving sensitivity when the length L1 of the monopole antenna 20 is changed in five steps of 10, 20, 30, 40, and 50 mm. In FIG. 8, results obtained when the length L1 of the monopole antenna 20 is 10 mm are plotted by ◇. Results obtained when L1 is 20 mm are plotted by □, and results obtained when L1 is 30 mm are plotted by △. Further, results obtained when L1 is 40 mm are plotted by ○, and results obtained when L1 is 50 mm are plotted by *.

As the results, as illustrated in FIG. 8, it was confirmed that the receiving sensitivity was high when the length L1 of the monopole antenna 20 was such that "20 mm≤L1≤50 mm", and was particularly high when the length L1 was such that "30 mm≤L1≤40 mm."

Next, with reference to FIG. 9, a description will be given of the relationship between the angle θ of the reflective member 30 and the receiving sensitivity when the measuring frequency is changed. The distal end portion 20a of the monopole antenna 20 is set to be aligned with the open end face 30a of the reflective member 30. In FIG. 9, the horizontal axis indicates the angle θ (°) of the reflective member 30, and the vertical axis indicates the receiving sensitivity (dBV/m).

FIG. 9 demonstrates results of simulations of the angle θ of the reflective member 30 and the receiving sensitivity when the length of the monopole antenna 20 is fixed at 30 mm and the measuring frequency is changed in three steps of 2, 2.5, and 3 GHz. In FIG. 9, results obtained when the measuring frequency is 2 GHz are plotted by ◇. Further, results obtained when the measuring frequency is 2.5 GHz are plotted by □, and results obtained when the measuring frequency is 3 GHz are plotted by △.

As the results, as demonstrated in FIG. 9, it was confirmed that, at any frequency, the receiving sensitivity was high when the angle θ of the reflective member 30 was such that "50°≤θ70°" and that the receiving sensitivity was the highest when the angle θ of the reflective member 30 was "60°."

Next, with reference to FIG. 10, a description will be given of the electric-field strength, that is, the receiving range (see FIG. 7), in the X-axis direction at the position 20 mm below the distal end portion of the electric field probe 1 (monopole antenna 20) when the angle θ of the reflective member 30 is changed. Here, the distal end portion 20a of the monopole antenna 20 is also set to be aligned with the open end face 30a of the reflective member 30. In a graph of FIG. 10, the horizontal axis indicates a length L2 (mm) in the X-axis direction from a position just beneath the electric field probe 1, and the vertical axis indicates the electric-field strength (dB).

FIG. 10 demonstrates changes in electric-field strength with respect to the distance L2 in the X-axis direction when the angle θ of the reflective member 30 is changed at intervals of 10° from 10° to 90°. As demonstrated in FIG. 10, it was found that the receiving range was wide when the angle θ of the reflective member 30 was 70° or more (see a one-dot chain line in FIG. 10) and that the receiving range was narrow when the angle θ was 60° or less (see a thick solid line in FIG. 10). That is, it was confirmed, from a viewpoint of narrowing the receiving range, the angle θ of the reflective member 30 was preferably "less than 70°," and more preferably, "60° or less."

As described in detail above, according to the embodiment, the receiving sensitivity can be increased and the receiving range can be narrowed by setting the length L1 of the monopole antenna 20 such that "20 mm≤L1≤50 mm," setting the angle θ of the reflective member 30 such that "50°≤θ70°," and aligning the open end face 30a of the reflective member 30 with the distal end portion 20a of the monopole antenna 20.

Further, according to the embodiment, the receiving sensitivity can be further increased and the receiving range can be further narrowed by setting the length L1 of the monopole antenna 20 such that "30 mm≤L1≤40 mm," setting the angle θ of the reflective member 30 at "about 60°," and aligning the open end face 30a of the reflective member 30 with the distal end portion 20a of the monopole antenna 20.

While an exemplary embodiment has been described above, the present disclosure is not limited to the above-described embodiment, and various modifications can be made. For example, the shapes and sizes of the monopole antenna 20 and the reflective member 30 are not limited to those adopted in the embodiment.

In particular, while the reflective member 30 is shaped like a cone with its bottom open in the above embodiment, the shape of the reflective member 30 is not limited to a conical shape. For example, the reflective member 30 may be shaped like a quadrangular pyramid with its bottom open or a hollow hemisphere with its bottom open.

While the inner conductor 11 of the semirigid cable is used as the monopole antenna 20 in the above embodiment, it is not always necessary to use the inner conductor 11 of the semirigid cable. For example, a common metal rod may be used. While the electric field probe 1 includes the main body 10 in the above embodiment, the main body 10 is not always necessary. For example, the main body 10 may be removed and the SMA connector 40 may be attached to the rear end portion of the monopole antenna 20.

In the embodiment in which an electric field probe includes a rodlike monopole antenna and a hollow and conductive reflective member provided coaxially with the monopole antenna to cover the monopole antenna, and in which one end portion of the reflective member is open in an axial direction of the monopole antenna, the monopole antenna is covered, or surrounded by the conductive reflective member. This reflective member is provided such that an aperture portion thereof faces in a axial direction of the monopole antenna, that is, in the null direction. For this reason, noise, which enters from a lateral direction of the electric field probe (a direction perpendicular to the axis of the monopole antenna, that is, a direction in which the monopole antenna exhibits directivity), is blocked. As a result, it is possible to measure only noise from a noise source located in the axial direction of the monopole antenna (electric field probe) (for example, a directly downward direction when the electric field probe is used with the aperture portion facing down from above an object to be measured). Hence, the near electric field can be measured in a narrowed receiving range.

In embodiment of the electric field probe of the present disclosure in which the monopole antenna is provided such that one end portion of the monopole antenna is substantially aligned with an open end face of the reflective member, if the one end portion of the monopole antenna protrudes outward from the open end face of the reflective member, noise from the lateral direction (the direction perpendicular to the axis of the monopole antenna, that is, the direction in which the monopole antenna has directivity) is apt to be picked up, and the receiving range is widened. Conversely, if the one end portion of the monopole antenna recedes inward from the open end face of the reflective member (that is, the reflective member is longer than the monopole antenna in the axial direction), the reflective member picks up noise, the ground (reference) potential fluctuates, and this deteriorates the receiving sensitivity. In this case, since the end portion (distal end portion) of the monopole antenna is substantially aligned with the open end face of the reflective member, the receiving range can be narrowed while maintaining high receiving sensitivity.

In embodiments of the electric field probe of the present disclosure in which the open one end portion of the reflective member is spread wider than the other end portion, the receiving sensitivity can be further increase. More specifically, preferably, the reflective member is shaped like a cone with a bottom open, a quadrangular pyramid with a bottom open, or a hollow hemisphere with a bottom open.

Embodiments according to the present disclosure make it is possible to narrow the receiving range to a desired range when measuring the near electric field.

The invention claimed is:

1. An electric field probe comprising:
a rodlike monopole antenna; and
a hollow and conductive reflective member provided coaxially with the monopole antenna to cover the monopole antenna,
wherein one end portion of the reflective member is open in an axial direction of the monopole antenna,
wherein the monopole antenna is provided such that one end portion of the monopole antenna is substantially aligned with the open end face of the reflective member,
wherein the open one end portion of the reflective member is spread wider than another end portion of the reflective member,
wherein a side wall of the reflective member has a linear cross section, and
wherein a signal received by the monopole antenna is output to a measuring device.

2. The electric field probe according to claim 1, wherein the reflective member is shaped like a cone with a bottom thereof comprising the open one end.

3. The electric field probe according to claim 1, wherein the reflective member is shaped like a quadrangular pyramid with a bottom thereof comprising the open one end.

4. The electric field probe according to claim 1, wherein the reflective member is shaped like a hollow hemisphere with a bottom thereof open.

5. The electric field probe according to claim 1, wherein the reflective member surrounds the monopole antenna to entirely cover the monopole antenna when viewed in a direction perpendicular to the axial direction.

6. The electric field probe according to claim 1, wherein the one end portion of the monopole antenna is a distal end of the monopole antenna that substantially coincides with a plane perpendicular to the axial direction and including the open end face of the reflective member.

7. The electric field probe according to claim 1, wherein a length of a portion of the monopole antenna covered by the reflective member is greater than or equal to 20 mm and less than or equal to 50 mm.

8. The electric field probe according to claim 1, wherein a length of a portion of the monopole antenna covered by the reflective member is greater than or equal to 30 mm and less than or equal to 40 mm.

9. The electric field probe according to claim 1, wherein an angle between a center line of the monopole antenna and the reflective member is greater than or equal to 50° and less than 70°.

10. The electric field probe according to claim 1, wherein an angle between a center line of the monopole antenna and the reflective member is about 60°.

* * * * *